(12) United States Patent
Trees et al.

(10) Patent No.: US 12,139,436 B2
(45) Date of Patent: Nov. 12, 2024

(54) DROPLET GENERATOR NOZZLE

(71) Applicant: ASML Netherlands B.V., Veldhoven (NL)

(72) Inventors: Dietmar Uwe Herbert Trees, San Diego, CA (US); Edwin Johan Buis, Belfeld (NL); Theodorus Wilhelmus Driessen, San Diego, CA (US); Benjamin Andrew Sams, San Diego, CA (US); Brandon Michael Johnson, Escondido, CA (US)

(73) Assignee: ASML Netherlands B.V., Veldhoven (NL)

( * ) Notice: Subject to any disclaimer, the term of this patent is extended or adjusted under 35 U.S.C. 154(b) by 341 days.

(21) Appl. No.: 17/767,179

(22) PCT Filed: Oct. 9, 2020

(86) PCT No.: PCT/EP2020/078518
§ 371 (c)(1),
(2) Date: Apr. 7, 2022

(87) PCT Pub. No.: WO2021/074043
PCT Pub. Date: Apr. 22, 2021

(65) Prior Publication Data
US 2022/0363596 A1 Nov. 17, 2022

Related U.S. Application Data

(60) Provisional application No. 62/916,723, filed on Oct. 17, 2019.

(51) Int. Cl.
*H05G 2/00* (2006.01)
*C03C 27/02* (2006.01)
*G03F 7/00* (2006.01)

(52) U.S. Cl.
CPC .......... *C03C 27/02* (2013.01); *G03F 7/70033* (2013.01); *H05G 2/006* (2013.01); *H05G 2/008* (2013.01); *C03C 2203/52* (2013.01)

(58) Field of Classification Search
CPC . C03C 27/02; C03C 2203/52; G03F 7/70033; H05G 2/006; H05G 2/008
See application file for complete search history.

(56) References Cited

U.S. PATENT DOCUMENTS

| 3,598,556 A | 8/1971 | Hunt |
| 4,025,327 A | 5/1977 | Harris |

(Continued)

FOREIGN PATENT DOCUMENTS

| CN | 1714923 A | 1/2006 |
| CN | 101978792 A | 5/2014 |

(Continued)

OTHER PUBLICATIONS

Ruth King, European International Searching Authority, International Search Report and Written Opinion, corresponding PCT Application No. PCT/EP2020/078518, mailed Feb. 25, 2021, 9 pages total.

*Primary Examiner* — Sean M Luck
(74) *Attorney, Agent, or Firm* — DiBerardino McGovern IP Group LLC (57) ABSTRACT

A method of manufacturing a nozzle for a droplet generator for a laser-produced plasma radiation source is disclosed. The method comprises disposing a glass capillary in a throughbore of a metal fitting, heating the metal fitting; and applying a pressure to the glass capillary such that the glass capillary conforms to the shape of, and forms a direct glass-to-metal seal with, the throughbore. Also disclosed is a nozzle for a droplet generator for a laser-produced plasma radiation source, and the radiation source itself, wherein the nozzle comprises the glass capillary for emitting fuel as (Continued)

droplets and the metal fitting for coupling the glass capillary to a body of the droplet generator, the glass capillary being conformed to a shape of a throughbore of the metal fitting, and wherein the glass capillary forms a direct glass-to-metal seal with the throughbore.

20 Claims, 3 Drawing Sheets

(56) References Cited

U.S. PATENT DOCUMENTS

| | | |
|---|---|---|
| 7,872,245 B2 | 1/2011 | Vaschenko et al. |
| 2004/0114720 A1 | 6/2004 | Orsini et al. |
| 2005/0276730 A1 | 12/2005 | Dannoux et al. |
| 2009/0230326 A1 | 9/2009 | Vaschenko et al. |
| 2010/0258747 A1 | 10/2010 | Vaschenko et al. |
| 2014/0102875 A1 | 4/2014 | De Dea et al. |
| 2019/0150266 A1* | 5/2019 | Lai .................... H05G 2/006 250/504 R |
| 2019/0163069 A1* | 5/2019 | Acuna ............... G03F 7/70033 |

FOREIGN PATENT DOCUMENTS

| | | |
|---|---|---|
| CN | 104885161 A | 12/2017 |
| EP | 0264465 A1 | 4/1988 |
| JP | H06056485 A | 3/1994 |
| JP | H11248969 A | 9/1999 |
| JP | 2005326295 A | 11/2005 |
| JP | 2015511170 A | 4/2015 |
| WO | 2004010745 A1 | 1/2004 |
| WO | 2013108047 A2 | 7/2013 |

* cited by examiner

DROPLET GENERATOR NOZZLE

CROSS REFERENCE TO RELATED APPLICATION

This application claims priority to U.S. Application No. 62/916,723, filed Oct. 17, 2019 and titled DROPLET GENERATOR NOZZLE, which is incorporated herein in its entirety by reference.

FIELD

The present invention relates to a nozzle for a droplet generator for a laser-produced plasma radiation source, and in particular a method for manufacturing the nozzle.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern from a patterning device (e.g., a mask) onto a layer of radiation-sensitive material such as photoresist, or simply resist, provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength greater that 4-20 nm.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin (Sn)), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Figure 1:
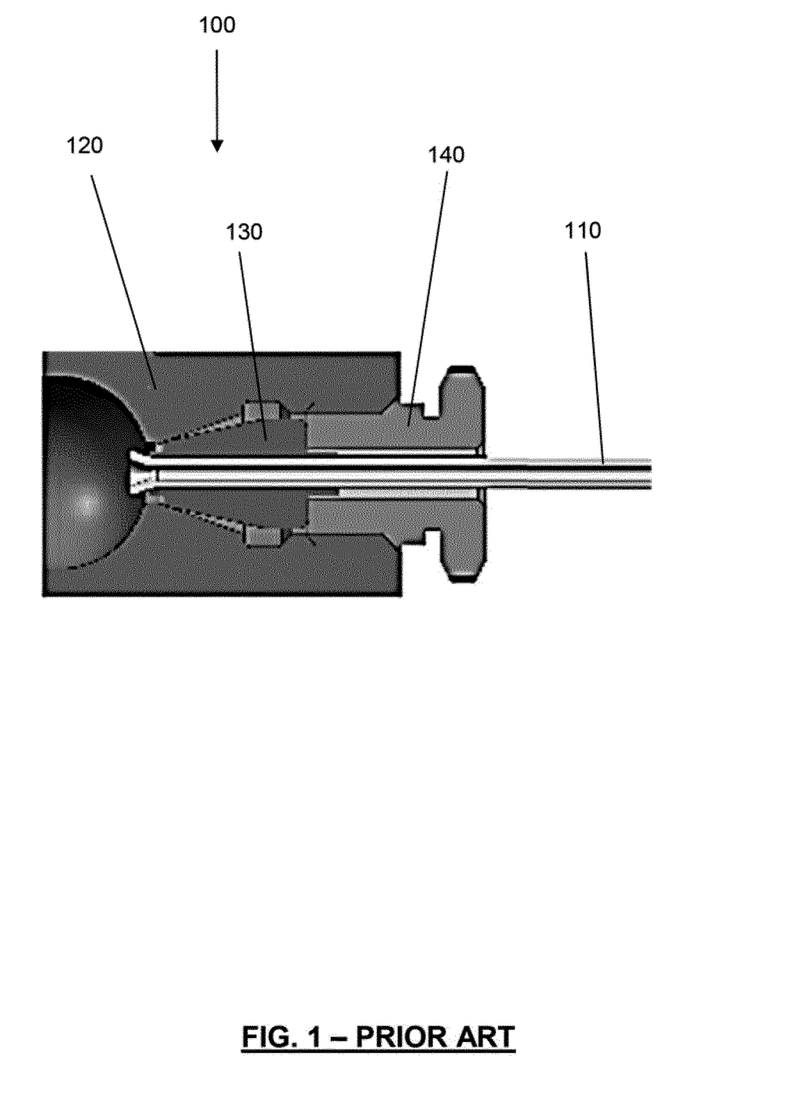
FIG. 1 depicts an example of a conventional nozzle for a droplet generator for a laser-produced plasma radiation source.

The fuel may be directed toward a path of the laser beam by a droplet generator. The droplet generator can include a nozzle assembly to emit the fuel as droplets. Such a nozzle assembly may operate in a pressurized and/or high temperature environment, and as such, it may be necessary to form temperature and pressure resistant seals (e.g. hermetic seals) between components of the nozzle assembly. Existing nozzle assemblies may comprise seals between components which suffer from poor reliability, stability and performance A prior art nozzle assembly 100 is depicted in FIG. 1. The nozzle assembly 100 comprises a glass capillary 110 for emitting droplets of fuel from a fuel emitter. The fuel emitter may be a droplet generator.

The glass capillary 110 may be coupled to a fitting 120, which may be a component of the fuel emitter, or may be coupled to the fuel emitter. The fitting 120 may comprise metal.

It is necessary to form a seal, e.g. a hermetic seal, between the glass capillary 110 and the fitting 120. The glass capillary 110 may be disposed within a throughbore of a ferrule 130. The ferrule 130 may comprise a compliant material relative to the glass capillary 110. That is, the ferrule 130 may be generally elastic and/or compressible.

In the prior art example of FIG. 1, the ferrule 130 is disposed within a throughbore of the fitting 120. A nut 140 is used to compress the ferrule 130 to form a substantially hermitic seal between the fitting 120 and the glass capillary 110.

Disadvantages of such a means for coupling the glass capillary 110 to the fitting 120 are as follows.

It has been shown that a maximum pressure that can be sustained by the compliant ferrule 130 in use is significantly limited. As such, the ferrule 130 may be subject to outgassing, for example outgassing of $H2O$, which may contaminate a fuel emitted by the glass capillary 110 in use.

Furthermore, the ferrule 130 may deform in use, thus impacting upon the reliability, stability and performance of a seal formed between the glass capillary 110 and the fitting 120. Furthermore, such deformation of the ferrule 130 may impact upon acoustic behavior of the nozzle 100.

In addition, the compliant ferrule 130 may reduce an overall stiffness of the glass capillary 110 relative to the fitting 120, which may lead to unwanted and/or excessive vibrations and general instabilities in the nozzle 100.

It is desirable to provide nozzle assemblies having reliable, stable and high performance seals between components that are subject to temperature and pressure variations during operation of the droplet generator and it is also desirable to provide a means to manufacture such nozzle assemblies. Furthermore, it is desirable to provide a seal that is not prone to substantial deformation in use, and is relatively inert when exposed to fluids, such as liquid tin, in use.

SUMMARY

According to an aspect of the present invention there is provided a method of manufacturing a nozzle for a droplet generator for a laser-produced plasma radiation source, the method comprising: disposing a glass capillary in a throughbore of a metal fitting; heating the metal fitting; and applying a pressure to the glass capillary such that the glass capillary conforms to the shape of, and forms a direct glass-to-metal seal with, the throughbore.

Advantageously, a direct glass-to-metal seal obviates a need to implement a ferrule to form a reliable, stable and high performance seal between the glass capillary and the metal fitting. Furthermore, such a glass-to-metal seal may improve an overall stiffness and acoustic behavior of the nozzle.

At least a portion of the throughbore may be frustum-shaped.

The throughbore may be cylindrical in shape.

Applying the pressure may comprise applying an internal pressure to the glass capillary.

Applying the pressure, e.g. the internal pressure, may comprise at least sealing a first opening of the glass capillary; and pumping a gas into a second opening of the glass capillary.

Applying the pressure may comprise applying an external pressure to the glass capillary. Applying an external pressure to the glass capillary may comprise applying opposing compressive forces to at least one of: portions of the glass capillary extending from the throughbore; and/or one or both ends of the glass capillary.

The opposing compressive forces may be applied in a longitudinal direction relative to the glass capillary. That is, the opposing compressive forces may be applied along a longitudinal direction of the glass capillary.

A rigid element, e.g. a mandrel or the like, may be inserted into the glass capillary before applying the external pressure.

The pressure may be applied to the glass capillary during and/or after heating the metal fitting.

The method of manufacturing the nozzle may comprise heating the glass capillary.

A coefficient of thermal expansion of the glass capillary may be substantially the same as, or less than, a coefficient of thermal expansion of the metal fitting. In particular, the coefficient of thermal expansion of the glass capillary may be substantially the same as, or less than, a coefficient of thermal expansion of the metal fitting over a temperature range comprising an operational temperature range of the nozzle and a manufacturing temperature range of the nozzle.

The metal fitting may comprise at least one of: molybdenum; tantalum; tungsten; or a metal alloy such as a nickel-cobalt ferrous alloy.

The glass capillary may comprise at least one of a borosilicate, an aluminosilicate; and/or quartz.

At least a portion of the metal fitting may comprise a metal oxide layer. For example, at least a portion of a throughbore of the metal fitting that forms the glass-to-metal seal may comprise a metal oxide layer.

The method may further comprise annealing the glass capillary and/or the metal fitting after allowing the metal fitting to cool.

Heating the metal fitting may comprise induction heating the metal fitting.

Heating the metal fitting may comprise heating the metal fitting and the glass capillary in a temperature controlled oven or chamber.

Heating the metal fitting may comprise heating the metal fitting in an inert atmosphere or a relative vacuum.

Disposing the glass capillary in the throughbore of the metal fitting may comprise disposing the glass capillary in the throughbore such that the glass capillary protrudes from both ends of the throughbore. At least one portion of the glass capillary that may protrude from the metal fitting may be removed by at least one of: sanding, grinding, polishing, and/or cutting.

According to a further aspect, there is provided a nozzle for a droplet generator for a laser-produced plasma radiation source, the nozzle comprising a glass capillary for emitting fuel as droplets; a metal fitting for coupling the glass capillary to a body of the droplet generator; the glass capillary being conformed to a shape of a throughbore of the metal fitting, and wherein the glass capillary forms a direct glass-to-metal seal with the throughbore.

The shape of the throughbore may include a uniformly cylindrical section and/or a frustum-shaped section.

The nozzle may be manufactured according to the method of: disposing a glass capillary in a throughbore of a metal fitting; heating the metal fitting; and applying a pressure to the glass capillary such that the glass capillary conforms to the shape of, and forms a direct glass-to-metal seal with, the throughbore.

According to a further aspect of the present invention, there is provided a laser-produced plasma radiation source comprising a droplet generator configured for providing a stream of droplets of fuel, wherein the droplet generator comprises a nozzle, the nozzle comprising: a glass capillary for emitting fuel as droplets; a metal fitting for coupling the glass capillary to a body of the droplet generator; the glass capillary being conformed to a shape of a throughbore of the metal fitting, and wherein the glass capillary forms a direct glass-to-metal seal with the throughbore.

BRIEF DESCRIPTION OF THE DRAWINGS

Embodiments of the invention will now be described, by way of example only, with reference to the accompanying schematic drawings, in which.

DETAILED DESCRIPTION

Figure 2:
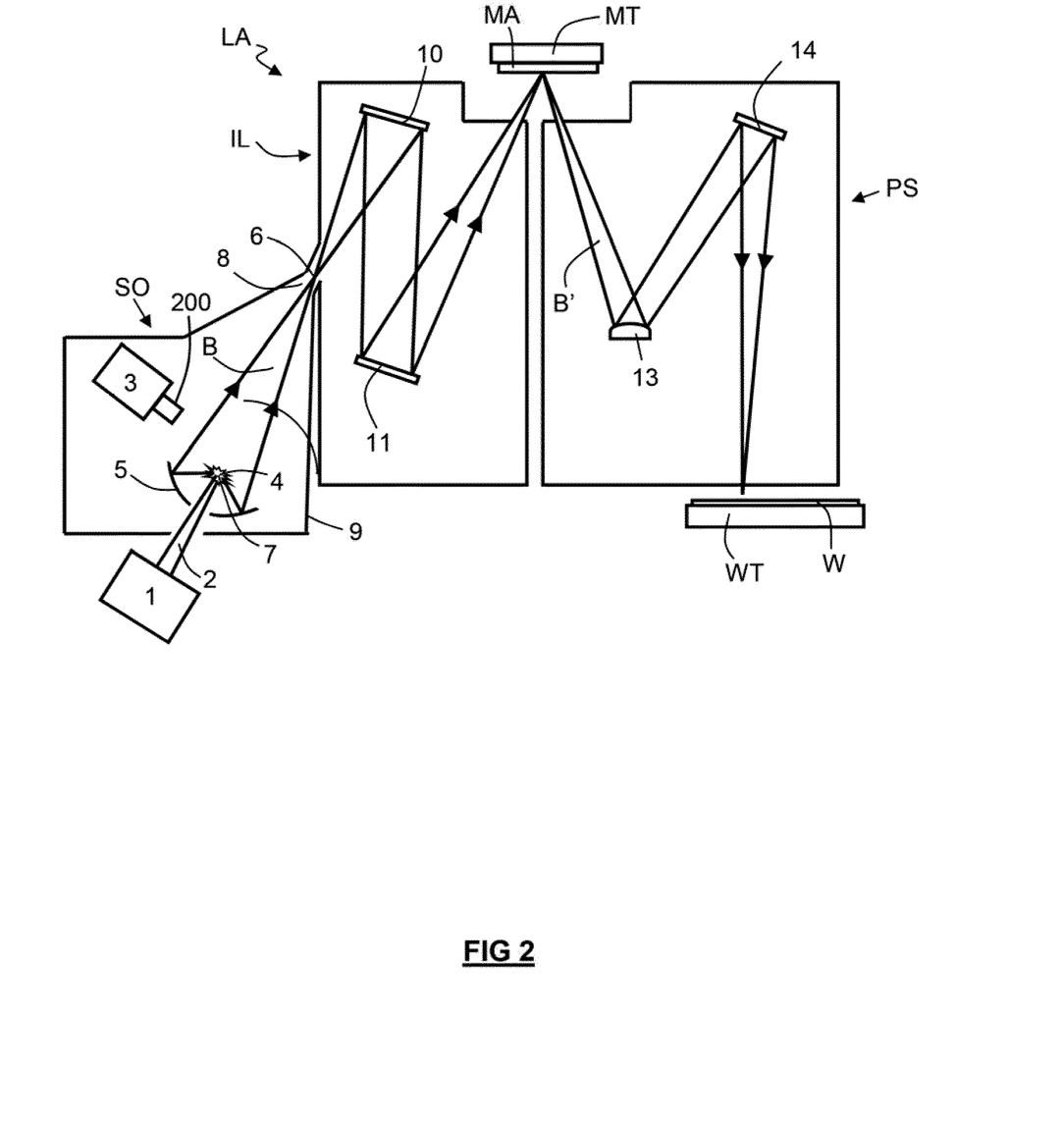
FIG. 2 depicts a lithographic system comprising a lithographic apparatus and a radiation source embodying the present invention.

FIG. 2 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask or reticle), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 2 is, for example, of a type which may be referred to as a laser produced plasma (LPP) source. A laser system 1, which may, for example, include a CO2 laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle 200 configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 2 depicts the radiation source SO as a laser produced plasma (LPP) source, any suitable source such as a discharge produced plasma (DPP) source or a free electron laser (FEL) may be used to generate EUV radiation.

As described above, the fuel emitter 3 may comprise a nozzle 200 configured to direct fuel, e.g. tin in the form of droplets, along a trajectory towards a plasma formation region 4.

Figure 3A:
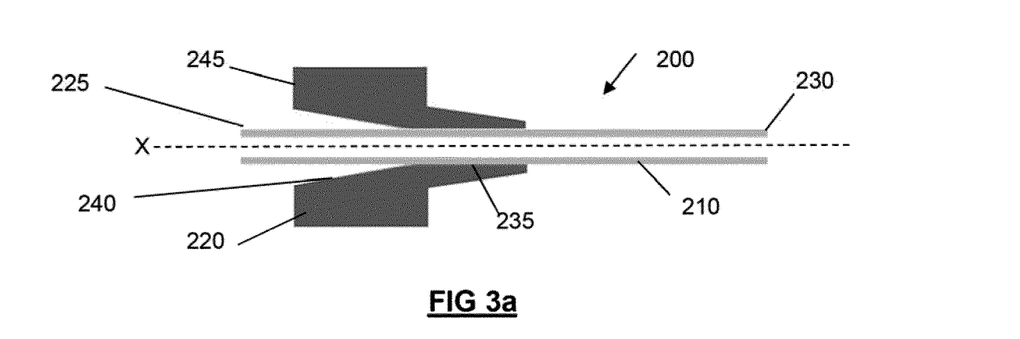
FIGS. 3a to 3c depict steps in a method for manufacturing a nozzle for a droplet generator for a laser-produced plasma radiation source, according to an embodiment of the invention.

FIG. 3a shows a glass capillary 210. The glass capillary 210 is a hollow glass tube, open at a first end 225 and at a second end 230. The glass capillary 210 may comprise, for example, a borosilicate, an aluminosilicate or quartz. The glass capillary 210 may comprise, for example, soda-lime glass, or alkali barium glass. The glass capillary 210 may comprise an alkali barium aluminoborosilicate glass. The glass capillary 210 may be optimized or modified, such as by mixing of alkali (Na and K) and/or alkaline earth (Ca and Mg), or the like, to achieve required physico-chemical properties. The glass capillary 210 may be a straight tube with constant inner and outer diameters, when disposed in metal fitting 220 which forms part of the nozzle such as nozzle 200 shown in FIG. 2.

Also shown in FIG. 3a is a metal fitting 220. The metal fitting 220 includes a throughbore 235. The metal fitting 220 may be formed of molybdenum, tantalum and/or tungsten, for example. In some embodiments, the metal fitting 220 may comprise, for example, aluminum and/or platinum. In some embodiments, the metal fitting 220 may comprise a metal alloy, such as stainless steel or the like.

In the example embodiment of FIG. 3a, a portion 240 of the throughbore 235 is substantially frustum-shaped. That is, the portion 240 has a substantially conical-shaped surface. Such a frustum/conical shape may be, for example, formed by machining the metal fitting 220 with a conical reamer. In other embodiments, the entire throughbore may be substantially frustum-shaped. In still other embodiments, the entire throughbore may be cylindrical. It will also be appreciated that in alternative embodiments falling within the scope of the present invention, the throughbore may be straight, or substantially straight. That is, in alternative embodiments all, or substantially all of the throughbore, may be straight, e.g. uniformly cylindrical. The shape of the throughbore may include a uniformly cylindrical section and a frustum-shaped section.

In one advantageous embodiment, an angle of the sidewalls of the portion 240 of the throughbore that is substantially frustum-shaped may be between approximately 2 and 5 degrees relative to a longitudinal axis X defined by a center of the throughbore 235, 240. Note that, for purposes of example only, the angle has been exaggerated in FIGS. 3a-d, which are not drawn to scale. In other embodiments falling within the scope of the present invention, the angle of sidewalls of the portion 240 of the throughbore that is substantially frustum-shaped may be between greater than 5 degrees or less than 2 degrees relative to the longitudinal axis X defined by the center of the throughbore 235, 240.

At least a portion of the metal fitting 220 may advantageously comprise an oxide layer on surface that forms the throughbore 235, and in particular the portion 240 of the throughbore 235 that is substantially frustum-shaped comprises an oxide layer. Such an oxide layer may provide a more robust and/or reliable and/or effective glass-to-metal seal. Beneficially, the provision of an oxide layer, e.g. a metal-oxide layer, provides oxygen atoms that may be used to form an effective glass-to-metal bond layer.

It will be appreciated that the provision of a metal-oxide layer is applicable to any metal used to form a glass-to-metal seal. For example, a metal fitting 220 comprising any of molybdenum, tungsten, tantalum, and/or a metal alloys such as a nickel-cobalt ferrous alloy, may comprise a metal oxide layer. In some example embodiments, at least a portion of the metal fitting 220, e.g. at least a portion of the throughbore of the metal fitting, may be oxidized to ensure an adequate and/or sufficient oxide layer is present prior to forming the glass-to-metal seal.

Should such an oxide layer be desired but found to be initially absent, or insufficient, the metal fitting 220 may be treated to form an oxide layer. For example, the metal fitting 220 may be heated in the presence of oxygen to accelerate formation of such an oxide layer.

A first step in the method of manufacturing the nozzle 200 for a droplet generator may comprise disposing the glass capillary 210 in the throughbore 235, 240 of the metal fitting 220.

In FIG. 3a, the first end 225 of the glass capillary 210 is shown extending from the metal fitting 220. In other embodiments, the first end 225 of the glass capillary 210 may be substantially flush with an end 245 or face of the metal fitting 220. It can be noted that, prior to the heating steps described below, glass capillary 210 does not have the same shape as the throughbore 235 including portion 240. Rather glass capillary 210 is straight with a constant outer diameter and does not conform to the shape of portion 240 or throughbore 235 prior to heating, as shown in FIG. 3a.

An outer diameter of the glass capillary 210 is slightly smaller than an internal diameter of the throughbore 235 in various embodiments. As such, the glass capillary 210 can be inserted into the throughbore 235. For example, a difference between the outer diameter of the glass capillary 210 and the internal diameter of the throughbore 235 may be in the region of 1 mm, 0.1 mm, or less but other differences in the respective diameters may be used in other embodiments.

A further step for manufacturing the nozzle 200 for a droplet generator may comprise heating the metal fitting 220 or heating the metal fitting 220 and the glass capillary 210. Heating of the metal fitting 220 and the glass capillary 210 may comprise disposing the metal fitting 220 and the glass capillary 210 in a temperature controlled oven or chamber. Heating the metal fitting 220 may comprise induction heating the metal fitting 220. By heating the metal fitting 220 by means of induction, the glass capillary may be heated by the metal fitting 220.

The heating process, along with the application of pressure as described below, causes the glass capillary 210 to conform to the shape of throughbore 235, including portion 240.

In one particular embodiment, the metal fitting 220 may be heated in a relatively inert atmosphere. For example, the metal fitting 220 may be disposed within a shroud, vessel, chamber, enclosure or the like, and exposed to a relatively inert gas such as nitrogen or argon. Beneficially, such a relatively inert gas may prevent oxidation of one or more surface of the glass capillary 210 or metal fitting 220. For example, a metal fitting 220 comprising molybdenum may be particularly subject to oxidation when heated in the presence of oxygen. Thus, heating the metal fitting 220 in the presence of a relatively inert gas may prevent, or at least minimize, such oxidation on a surface of the metal fitting 220 and/or glass capillary 210 where an oxide layer is undesired. For example, it may be desirable to have an oxide layer present only on a portion of a surface of the metal fitting 220 that forms the glass-to-metal seal.

The inert atmosphere may be provided as a gas flow. As such, a temperature of the atmosphere may be controlled. A temperature of the atmosphere may be controlled or maintained at a relatively constant level. Beneficially, by providing the inert atmosphere as a gas flow, heating of the inert atmosphere may be minimized Beneficially, the gas flow may have a cooling effect on portions of the glass capillary 210 exposed to the gas flow. Thus, unwanted deformation of one or more portions of the glass capillary 210 that extend or protrude from the metal fitting 220 may be limited.

In yet a further embodiment, the metal fitting 220 may be heated in a relative vacuum environment, e.g. a low-pressure environment. For example, the metal fitting 220 may be disposed within a shroud, vessel, chamber, enclosure or the like, and a surrounding gas, such as air, may be expelled or otherwise pumped or motivated from the shroud, vessel, chamber or enclosure to achieve a relative vacuum, e.g. a partial vacuum or a low-pressure environment. Beneficially, a relative vacuum, e.g. a partial vacuum or a low-pressure environment may prevent oxidation of one or more surface of the glass capillary 210 or metal fitting 220. For example, a metal fitting 220 comprising Molybdenum may be particularly subject to oxidation when heated in the presence of Oxygen. Thus, heating the metal fitting 220 in a relative vacuum or a low-pressure environment may prevent, or at least minimize, such oxidation.

The heating, and pressurization described below, causes the glass capillary 210 to expand within the metal fitting 220 to conform with the shape of throughbore 235 of the metal fitting. It will be noted that a portion of the glass capillary 210 that expands within the metal fitting 220 comprises a thinner sidewall than portions of the glass capillary 210 that may be exposed to the gas flow. Beneficially, such a gas flow may ensure that a thickness of the sidewall of portions of the glass capillary 210 that may be exposed to the gas flow are maintained at a desired level, and not subject to unwanted deformation, such as expansion, which may thin the sidewall of the glass capillary 210.

In one embodiment, a gas flow of argon of between 4 and 8 standard liters per minute is provided, but other gas flows are used in other embodiments.

The glass capillary 210 may also be directly heated, e.g. concurrently with heating the metal fitting, such as by temperature controlled oven or chamber. Alternatively (or additionally) the glass capillary 210 may be heated by the metal fitting 220 as described above.

By heating the metal fitting 220, the glass capillary 210 may be heated to a level where the glass capillary 210 becomes soft. That is, the glass capillary 210 may become heated to a level whereby the glass capillary 210 transitions from a rigid state to a softened state, e.g. a relatively pliable or partially melted state. That is, the glass capillary 210 may be heated, either directly or by the metal fitting 220, until a viscosity of the glass that forms the glass capillary 210 is reduced to an extent that the glass becomes relatively pliable.

The metal fitting 220 may be heated to a temperature in the range of 800K to 2000K. A temperature to which the metal fitting 220 may be heated may depend upon a material used for the glass capillary 210. For example, a temperature in the region of 1800K may be required for a glass capillary 210 comprising quartz and a temperature in the region of 800K may be required for a glass capillary 210 comprising a Borosilicate.

The metal fitting 220 may be heated to at least a working temperature of the glass capillary 210, e.g. a temperature at which the glass capillary 210 becomes pliable. Preferably, the metal fitting 220 is not heated to a temperature that would cause the glass capillary 210 or the metal fitting 220 to deform excessively under its own weight.

A further step for manufacturing the nozzle 200 for a droplet generator may comprise applying an internal or external pressure to the glass capillary 210 such that the glass capillary 210 conforms to the shape of, and forms a direct glass-to-metal seal with, the throughbore 235, as will be described with reference to FIG. 3b and FIG. 3c.

Figure 3B:
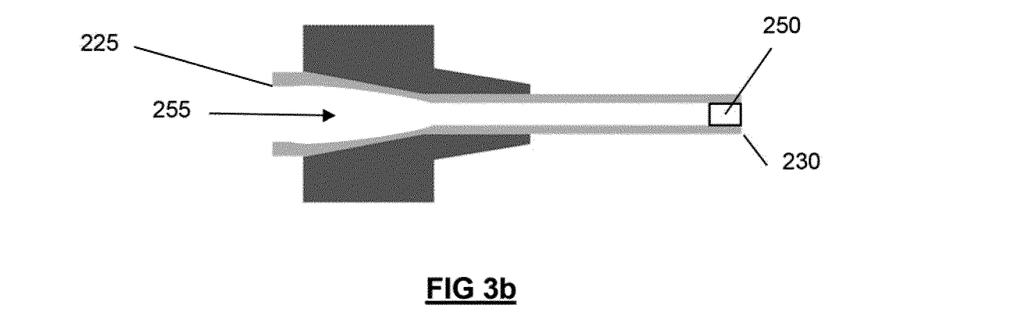

FIG. 3b depicts an internal pressure being applied to the glass capillary 210. The step of applying the internal pressure to the glass capillary 210 may comprises a step of sealing a first opening 225 or a second opening 230 of the glass capillary 210. In the illustrated embodiment of FIG. 3b, the second opening 230 is sealed with cap 250.

The step of sealing the first or second opening 225, 230 may be performed before or after the step of heating the metal fitting 220. For example, after the metal fitting 220 is heated such that the glass capillary 210 is softened, the first or second opening 225, 230 may be sealed by compressing, e.g. pinching or crimping, a portion of the glass capillary 210 at the first or second opening 225, 230. Furthermore, the step of sealing the first or second opening 225, 230 may be performed before or after the step of disposing the glass capillary 210 in the throughbore 235, 240 of the metal fitting 220.

The first or second opening 225, 230 may be sealed by, for example, a stopper, lid or cap. Additionally or alternatively, the first or second opening 225, 230 may be sealed by, for example, a glue or resin, such as a curable resin, or the like.

The first or second opening 225, 230 may be sealed by, for example, by heating and at least partially melting the glass capillary 210. For example, the glass capillary 210 may be heated and then crimped to form a seal The seal may advantageously be an airtight seal, e.g. a hermetic seal.

The step of applying the internal pressure to the glass capillary 210 may also comprise pumping a gas into the other of the first or second opening 225, 230 of the glass capillary 210. That is, if the first opening 225 is sealed, the gas may be pumped into the second opening 230. Conversely if the second opening 230 is sealed, the gas may be pumped into the first opening 225. Preferably, the gas is a relatively inert gas (relative to the metal fitting 220 and the glass capillary 210), such as nitrogen and/or argon.

The internal pressure may be applied during and/or after heating the metal fitting 220 and the glass capillary 210.

For purposes of example only, FIG. 3b shows a cap 250 sealing the second end 230 of the glass capillary 210. In the example of FIG. 3b, the gas is pumped into the first end 225 of the glass capillary, in a direction shown by arrow 255.

A pump, or compressor, may be communicably coupled to the glass capillary 210 to pump the gas into the first end 225 of the glass capillary. For example, as shown in FIG. 3b, a portion of the glass capillary protrudes from, e.g. extends outwardly from, the end 245 or face of the metal fitting 220. As such, a hose or pipe (not shown) may be attached to the protruding portion of the glass capillary 210 using any suitable means to form a seal between the hose or pipe and the glass capillary 210. The pump, or compressor, may be communicably coupled to the hose or pipe, and therefore configured to apply an internal pressure to the glass capillary 210.

As the gas is pumped into the glass capillary 210, a pressure within the glass capillary 210 increases. In one embodiment, a pressure within the glass capillary 210 may be set to approximately 0.5 bar but in other embodiments, a pressure within the glass capillary 210 may be set or increased to between 0.1 bar and 10 bar, or higher.

Due to the applied internal pressure and to the relative pliability of the glass capillary 210, which is due to heating of the metal fitting 220 and/or the glass capillary 210, the glass capillary 210 expands and/or deforms within the throughbore 235, 240 of the metal fitting 220 until it contacts the throughbore of the metal fitting 220. In particular, and as shown in FIG. 3b, the glass capillary 210 expands and/or deforms within the frustum-shaped portion 240 of the throughbore until it contacts the frustum-shaped portion 240 of the throughbore of the metal fitting 220. As such, the glass capillary 210 expands and/or deforms such that the glass capillary conforms to the shape of the throughbore 235, and in particular the frustum-shaped portion 240 of the throughbore.

As previously described, the throughbore may be straight, or substantially straight, e.g. the throughbore may not have a frustum-shaped portion. That is, in alternative embodiments all, or substantially all of the throughbore, may be straight, e.g. uniformly cylindrical. In such embodiments, due to the applied internal pressure and to the relative pliability of the glass capillary 210, which is due to heating of the metal fitting 220 and/or the glass capillary 210, the straight glass capillary 210 may expand and/or deform within the throughbore 235, 240 of the metal fitting 220 until it contacts the throughbore of the metal fitting 220.

Furthermore, due to the pressure applied by the gas, the temperature of the metal fitting 220, and the temperature of the glass capillary 210, a glass-to-metal seal is formed between the glass capillary 210 and the metal fitting 220.

After the glass-to-metal seal has been formed, the cap 250 or seal may be removed. The removal of the cap 250 or seal may comprise removal, e.g. cutting away, of a portion of the glass capillary 210.

Figure 3C:
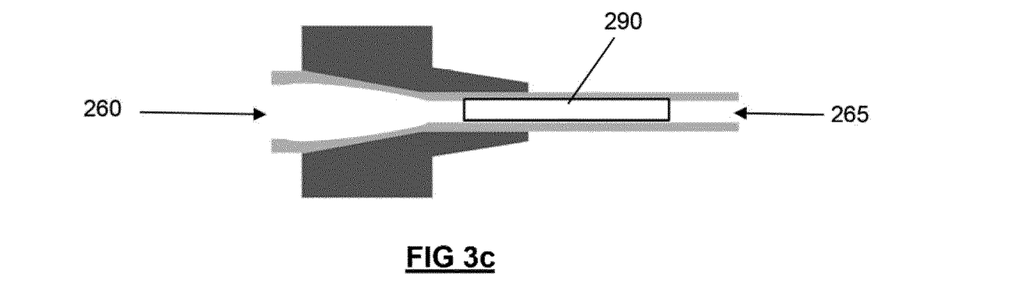

FIG. 3c depicts an external pressure being applied to the glass capillary 210. The step of applying the external pressure to the glass capillary 210 may comprise applying opposing compressive forces to at least one of: portions of the glass capillary 210 extending from the throughbore; and/or ends 225, 230 of the glass capillary.

The external pressure may be applied during and/or after heating the metal fitting 220 and the glass capillary 210.

In the example of FIG. 3c, pressure is applied to the ends 225, 230 of the glass capillary 210 in the directions shown by arrows 260, 265. That is, the directions shown by arrows 260, 265 are generally opposing. As such, the forces are compressive forces, which act to compress the glass capillary 210.

Due to the applied external pressure and the relative pliability of the glass capillary 210, which is due to heating of the metal fitting 220 and/or the glass capillary 210, the glass capillary 210 expands and/or deforms within the throughbore 235, 240 of the metal fitting 220 until it contacts the throughbore of the metal fitting 220. In particular, and as shown in FIG. 3c, the glass capillary 210 expands and/or deforms within the frustum-shaped portion 240 of the throughbore until it contacts the frustum-shaped portion 240 of the throughbore of the metal fitting 220. As such, the glass capillary 210 expands and/or deforms such that the glass capillary conforms to the shape of the throughbore 235, and in particular the frustum-shaped portion 240 of the throughbore.

As previously described, the throughbore may be straight, or substantially straight, e.g. the throughbore may not have a frustum-shaped portion. That is, in alternative embodiments all, or substantially all of the throughbore, may be straight, e.g. uniformly cylindrical. In such embodiments, due to the applied external pressure and to the relative pliability of the glass capillary 210, which is due to heating of the metal fitting 220 and/or the glass capillary 210, the straight glass capillary 210 may expand and/or deform within the throughbore 235, 240 of the metal fitting 220 until it contacts the throughbore of the metal fitting 220.

Furthermore, due to the applied external pressure, the temperature of the metal fitting 220, and the temperature of the glass capillary 210, a glass-to-metal seal is formed between the glass capillary 210 and the metal fitting 220.

As shown in FIG. 3c, the opposing compressive forces shown by arrows 260, 265 are applied in a longitudinal direction relative to the glass capillary 210. Such external forces may be applied by any appropriate means, such as by disposing the glass capillary 210 in a machine press. Such a machine press may be mechanical, hydraulic or pneumatic. Such external forces may be applied by disposing the glass capillary 210 between intermediate members, such as plates, and subsequently applying the external pressure to the intermediate members. Such external forces may be applied by gripping one or more portions of the glass capillary, such as by one or more clamps or the like, and moving the one or more clamps relative to the metal fitting 220.

The step of applying the external pressure to the glass capillary 210 may also comprise inserting a rigid element 290, such as a mandrel, into the glass capillary 210 before applying the external pressure. Such a rigid element may prevent a throughbore of the glass capillary 210 from collapsing or excessively deforming in an unwanted direction due to the applied external forces.

Figure 3D:
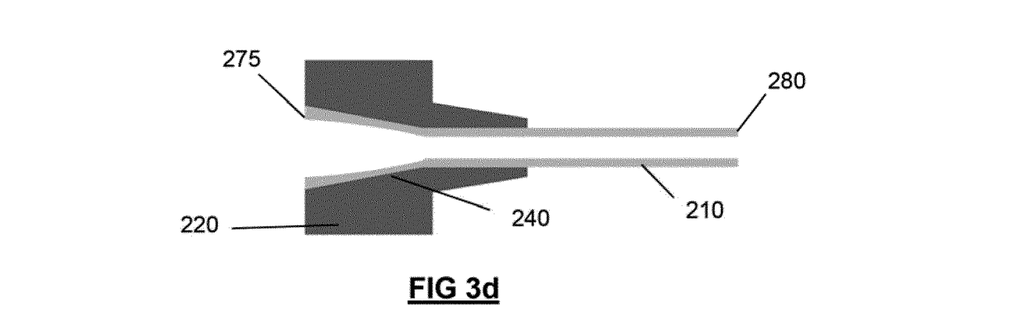
FIG. 3d depicts a nozzle manufactured by a method according to an embodiment of the present invention.

FIG. 3d depicts a nozzle manufactured by a method according to an embodiment of the present invention. In contrast to FIGS. 3b and 3c, the portion of the glass capillary 210 that protrudes from, e.g. stands proud of, the end 245 or face of the metal fitting 220 has been removed. Removal of the portion may comprise at least one of sanding, grinding, polishing, and/or cutting. In other embodiments, the portion of the glass capillary 210 that protrudes from the end 245 or face of the metal fitting 220 may be left in situ, and/or formed into a rim.

A further step in the method of manufacturing the nozzle 200 for a droplet generator may comprise cooling the metal fitting 220. Such cooling may be active cooling, e.g. by refrigeration or by means of a cooled gas flow, or by natural cooling, e.g. leaving the metal fitting 220 to cool down to an ambient temperature. Such cooling may follow or adhere to a pre-defined temperature profile. Beneficially, such cooling may at least partially anneal the glass capillary, thus reducing internal stresses within the glass capillary.

Furthermore, an end of the glass capillary (e.g. after removal of the abovementioned protruding portion) and/or the end 245 or face of the metal fitting 220 may be ground and/or polished. Such grinding and/or polishing may provide a smooth surface, such that an end of the glass capillary 210 is flush with the end 245 or face of the metal fitting 220. Furthermore, such grinding or polishing may remove unwanted debris or oxide layers. In particular, for a metal fitting 220 comprising molybdenum, a molybdenum oxide layer may have formed on the end 245 or face of the metal fitting 220. Such polishing and/or grinding may remove such an oxide layer.

The method may comprise a step of annealing the glass capillary 210 and/or the metal fitting 220. The particular temperatures and/or heating and/or cooling rates required for annealing of the glass capillary 210 may depend upon the particular glass type and/or composition of glass. For example, the glass capillary 210 may be heated to approximately 600K to 800K, before cooling to an ambient temperature, but other temperatures can also be used in other embodiments. Such an annealing step may be repeated one or more times.

The step of annealing the glass capillary 210 may be performed before and/or after the step of removing the portion of the glass capillary 210 that protrudes from, e.g. stands proud of, the end 245 or face of the metal fitting 220.

Beneficially, the frustum-shaped throughbore of the example embodiment shown in FIGS. 3a to 3d provides enhanced sealing between the glass capillary 210 and the metal fitting 220 in use. That is, in use a pressure may be applied to an internal surface, e.g. internal sidewall, of the glass capillary 210 due to a pressurized fuel being entering the glass capillary 210 at a first opening 275 and being ejected or emitted from the glass capillary 210 at a second opening 280. Such pressure exerted by the fuel may, to some extent, further expand the glass capillary 210 thus pressing the glass capillary 210 against the metal fitting 220. Thus, the glass-to-metal seal between the glass capillary 210 and the metal fitting 220 may form, at least to some extent, a self-energizing seal, e.g. a seal that is improved due to the pressure applied to the internal surface of the glass capillary 210 in use.

It is advantageous that a coefficient of thermal expansion (CTE) of the metal fitting 220 is substantially the same as, or within a predefined range relative to, a CTE of the glass capillary 210 over an operational temperature range of the nozzle 200. Furthermore, it is also advantageous that a CTE of the metal fitting 220 is substantially the same as, or within a predefined range relative to, a CTE of the glass capillary 210 over a temperature range which includes temperatures required to form the glass-to-metal seal, e.g. a manufacturing temperature range of the nozzle. That is, the glass-to-metal seal is formed at a temperature wherein the glass becomes soft, and is subsequently cooled to room temperature. As such, it is advantageous that a CTE of the metal fitting 220 is substantially the same as, or within a predefined range relative to, a CTE of the glass capillary 210 over an entire temperature range that includes the temperature at which the glass becomes soft and room temperature, and preferably also an operational temperature range of the nozzle 200, which may comprise temperatures less than room temperature.

For example, a metal fitting comprising molybdenum may have a CTE of approximately 5.5 ppm/K. As such, predefined range for the CTE of a glass capillary may be, for example, +/−0.5 ppm/K. Various borosilicate or aluminosilicate glasses comprise a CTE matched to within +/−0.5 ppm/K to molybdenum. A glass capillary having a CTE lower than that of the metal fitting may be selected to create an interference fit between the metal fitting and the glass capillary. For example, one embodiment may comprise a metal fitting comprising molybdenum and a glass capillary comprising a borosilicate with a CTE of approximately 3.3 ppm/K. Such pressure may beneficially cause the glass-to-metal seal to additionally and/or at least partially, form an interference fit between the metal fitting and the glass capillary. That is, in use a pressure may be applied to an internal surface of the glass capillary 210 whereby the pressure may, to some extent, further expand the glass capillary 210 thus pressing the glass capillary 210 against the metal fitting 220.

The operational temperature range may depend upon the fuel emitted or ejected by the nozzle 200. For example, the operational temperature range for liquid tin as a fuel may be approximately 300 K to 530 K.

Furthermore, in use a fuel provided by the droplet generator may be, for example a tin compound, e.g., SnBr4, SnBr2, SnH4, or a tin alloy, e.g., tin-gallium alloys, tin-indium alloys, tin-indium-gallium alloys, or a combination thereof. Depending on the material used, the target material may be provided by the droplet generator at various temperatures including room temperature or near room temperature (e.g., tin alloys, SnBr4), at an elevated temperature, (e.g., pure tin) or at temperatures below room temperature, (e.g., SnH4). Thus, it is particularly beneficial to form a glass-to-metal seal between the glass capillary 210 and the metal fitting 220 that is relatively temperature invariant in terms of its performance across an entire operational temperature range.

By closely matching a CTE of the glass capillary 210 to the CTE of the metal fitting 220, cracking of the glass capillary after heating-up the nozzle to a working temperature, e.g. 500 to 500 K for molten tin, may be avoided.

The CTE of the glass capillary 210 may be closely matched to, or slightly lower than but not slightly higher than, the CTE of the metal fitting 220. For example, during manufacture of the nozzle, and/or in use, if the CTE of the glass capillary 210 is higher than the metal fitting 220, then during cooling of the nozzle 200 the glass capillary 210 will contract faster than the metal fitting 220 contracts. Such a difference in contraction rates between the glass capillary 210 and the metal fitting 220 may be detrimental to the integrity of the glass-to-metal seal. That is, such a difference in contraction rates between the glass capillary 210 and the metal fitting 220 may cause the glass capillary to separate from the metal fitting 220. Thus, it is beneficial to have the contraction rate of the glass capillary 210 less than or equal to that of the metal fitting 220.

The term "inert" used throughout this specification should be construed as meaning chemically inert relative to the glass capillary 201 and the metal fitting 220.

The term "glass-to-metal" seal refers to a seal, e.g. a hermetic seal between a glass and a metal, wherein the metal is construed as comprising a metal, a metal alloy, and/or a metal oxide. That is, the term "glass-to-metal seal" should be understood to comprise a seal between a glass and a metal, wherein the metal may comprise an oxide layer. For example, in a particular embodiment of the present invention, wherein the metal fitting comprises molybdenum, the term "glass-to-metal seal" includes a seal between the glass capillary 210 and a surface of the metal fitting, wherein prior to the seal being formed a surface of the metal fitting 220 that is to be sealed to the glass capillary 210 may have comprised an oxide layer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference has been made above to the use of embodiments of the invention in the context of a droplet generator for a laser-produced plasma radiation source, it will be appreciated that a nozzle manufactured according to the claimed and described method(s) may find utility and/or be suitable for use in a variety of other applications. For example, such a nozzle may be generally applicable to any fluid conveyance application, and in particular any fluid conveyance application wherein the fluid to be conveyed is under pressure.

Although specific reference may have been made above to the use of embodiments of the invention in the context of optical lithography, it will be appreciated that the invention, where the context allows, is not limited to optical lithography and may be used in other applications, for example imprint lithography.

Other aspects of the invention are set out in the following numbered clauses.

1. A method of manufacturing a nozzle for a droplet generator, the method comprising:
disposing a glass capillary in a throughbore of a metal fitting;
heating the metal fitting; and
applying a pressure to the glass capillary such that the glass capillary conforms to the shape of, and forms a direct glass-to-metal seal with, the throughbore.
2. The method of clause 1, wherein at least a portion of the throughbore is frustum-shaped.
3. The method of clause 1, wherein the disposing a glass capillary in a throughbore of a metal fitting comprises disposing the glass capillary in the form of a tube with a constant diameter and wherein the heating and applying a pressure change the shape of the capillary.
4. The method of any of clauses 1 to 3, wherein applying the pressure comprises applying an internal pressure to the glass capillary and comprises at least:
sealing a first opening of the glass capillary; and
pumping a gas into a second opening of the glass capillary.
5. The method of any of clauses 1 to 3, wherein the step of applying the pressure comprises applying an external pressure to the glass capillary by applying opposing compressive forces to at least one of:
portions of the glass capillary extending from the throughbore; and
one or both ends of the glass capillary.
6. The method of clause 5, wherein the opposing compressive forces are applied along a longitudinal direction of the glass capillary.
7. The method of clause 5, further comprising the step of inserting a rigid element into the glass capillary before applying the external pressure.
8. The method of any preceding clause, wherein the pressure is applied to the glass capillary during and/or after heating the metal fitting.
9. The method of any preceding clause, wherein a coefficient of thermal expansion of the glass capillary is less than or equal to a coefficient of thermal expansion of the metal fitting over a temperature range comprising an operational temperature range of the nozzle and a manufacturing temperature range of the nozzle.
10. The method of any preceding clause, wherein the metal fitting comprises molybdenum, tantalum, tungsten, or a metal alloy and/or the glass capillary comprises a borosilicate, an aluminosilicate or quartz.
11. The method of any preceding clause, wherein at least a portion of the metal fitting comprises a metal oxide layer.
12. The method of any preceding clause further comprising annealing the glass capillary and/or the metal fitting after allowing the metal fitting to cool.
13. The method of any preceding clause, wherein heating the metal fitting comprises induction heating the metal fitting.
14. The method of clause 13, further comprising providing a flow of an inert gas during the induction heating, the flow directed to the glass capillary.
15. The method of clause 1, wherein the throughbore is cylindrical in shape.
16. The method of any preceding clause, wherein the step of heating the metal fitting comprises heating the metal fitting in an inert atmosphere or a relative vacuum.
17. The method of any preceding clause, wherein the step of disposing the glass capillary in the throughbore of the metal fitting comprises disposing the glass capillary in the throughbore such that the glass capillary protrudes from both ends of the throughbore.
18. The method of clause 17, wherein at least one portion of the glass capillary that protrudes from the metal fitting is removed by at least one of: sanding, grinding, polishing, and/or cutting.
19. A nozzle for a droplet generator for a laser-produced plasma radiation source, the nozzle comprising:

a glass capillary for emitting fuel as droplets;

a metal fitting for coupling the glass capillary to a body of the droplet generator;

the glass capillary being conformed to a shape of a throughbore of the metal fitting, and wherein the glass capillary forms a direct glass-to-metal seal with the throughbore.

20. The nozzle of clause 19, wherein the shape of the throughbore includes a uniformly cylindrical section and/or a frustum-shaped section.

21. The nozzle of clause 19, wherein the nozzle is manufactured according to the method of:

disposing the glass capillary in the throughbore of the metal fitting;

heating the metal fitting; and applying a pressure to the glass capillary such that the glass capillary conforms to the shape of, and forms a direct glass-to-metal seal with, the throughbore.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of manufacturing a nozzle for a droplet generator, the method comprising:
    disposing a glass capillary in a throughbore of a metal fitting;
    heating the metal fitting; and
    applying a pressure to the glass capillary such that the glass capillary conforms to the shape of, and forms a direct glass-to-metal seal with, the throughbore.

2. The method of claim 1, wherein at least a portion of the throughbore is frustum-shaped.

3. The method of claim 2, wherein the disposing a glass capillary in a throughbore of a metal fitting comprises disposing the glass capillary in the form of a tube with a constant diameter and wherein the heating and applying a pressure change the shape of the glass capillary.

4. The method of claim 1, wherein applying the pressure comprises applying an internal pressure to the glass capillary and comprises at least:
    sealing a first opening of the glass capillary; and
    pumping a gas into a second opening of the glass capillary.

5. The method of claim 1, wherein applying the pressure comprises applying an internal pressure to the glass capillary and comprises at least:
    sealing a first opening of the glass capillary; and
    pumping a gas into a second opening of the glass capillary.

6. The method of claim 3, wherein the step of applying the pressure comprises applying an external pressure to the glass capillary by applying opposing compressive forces to at least one of:
    portions of the glass capillary extending from the throughbore; and
    one or both ends of the glass capillary.

7. The method of claim 1, wherein the step of applying the pressure comprises applying an external pressure to the glass capillary by applying opposing compressive forces to at least one of:
    portions of the glass capillary extending from the throughbore; and
    one or both ends of the glass capillary.

8. The method of claim 7, further comprising the step of inserting a rigid element into the glass capillary before applying the external pressure.

9. The method of claim 1, wherein the pressure is applied to the glass capillary during and/or after heating the metal fitting.

10. The method of claim 1, wherein a coefficient of thermal expansion of the glass capillary is less than or equal to a coefficient of thermal expansion of the metal fitting over a temperature range comprising an operational temperature range of the nozzle and a manufacturing temperature range of the nozzle.

11. The method of claim 1, wherein the metal fitting comprises molybdenum, tantalum, tungsten, or a metal alloy and the glass capillary comprises a borosilicate, an aluminosilicate, or quartz.

12. The method of claim 11, wherein at least a portion of the throughbore is frustum-shaped and the disposing a glass capillary in a throughbore of a metal fitting comprises disposing the glass capillary in the form of a tube with a constant diameter and wherein the heating and applying a pressure change the shape of the capillary.

13. The method of claim 1, wherein at least a portion of the metal fitting comprises a metal oxide layer.

14. The method of claim 1, further comprising annealing the glass capillary and/or the metal fitting after allowing the metal fitting to cool.

15. The method of claim 1, wherein heating the metal fitting comprises induction heating the metal fitting.

16. The method of claim 15, further comprising providing a flow of an inert gas during the induction heating, the flow being directed to the glass capillary.

17. The method of claim 1, wherein the step of heating the metal fitting comprises heating the metal fitting in an inert atmosphere or a relative vacuum.

18. A nozzle for a droplet generator for a laser-produced plasma radiation source, the nozzle comprising:
    a glass capillary for emitting fuel as droplets; and
    a metal fitting for coupling the glass capillary to a body of the droplet generator;
    the glass capillary being conformed to a shape of a throughbore of the metal fitting, and wherein the glass capillary forms a direct glass-to-metal seal with the throughbore.

19. The nozzle of claim 18, wherein the shape of the throughbore includes a uniformly cylindrical section and/or a frustum-shaped section.

20. The nozzle of claim 18, wherein the nozzle is made by disposing the glass capillary in the throughbore of
    the metal fitting,
    heating the metal fitting, and
    applying a pressure to the glass capillary such that the glass capillary conforms to the shape of, and forms a direct glass-to-metal seal with, the throughbore.

* * * * *